(12) United States Patent
Kiplinger et al.

(10) Patent No.: US 10,455,707 B1
(45) Date of Patent: Oct. 22, 2019

(54) CONNECTION PAD FOR EMBEDDED COMPONENTS IN PCB PACKAGING

(71) Applicant: Apple Inc., Cupertino, CA (US)

(72) Inventors: Kenneth Leland Kiplinger, Los Gatos, CA (US); Mark J. Beesley, Carmel Valley, CA (US); Shawn Xavier Arnold, Santa Cruz, CA (US); Shyam Harindralal Ratnayake, San Jose, CA (US); Meng Chi Lee, Los Altos, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/100,456

(22) Filed: Aug. 10, 2018

(51) Int. Cl.
| | |
|---|---|
| *H05K 3/34* | (2006.01) |
| *H05K 3/46* | (2006.01) |
| *H05K 1/11* | (2006.01) |
| *H05K 1/18* | (2006.01) |
| *H01L 23/498* | (2006.01) |

(52) U.S. Cl.
CPC ..... *H05K 3/3436* (2013.01); *H01L 23/49816* (2013.01); *H01L 23/49838* (2013.01); *H05K 1/112* (2013.01); *H05K 1/185* (2013.01); *H05K 1/189* (2013.01); *H05K 3/3463* (2013.01); *H05K 3/4623* (2013.01); *H05K 3/4691* (2013.01); *H05K 2201/09481* (2013.01); *H05K 2201/10227* (2013.01); *H05K 2201/10431* (2013.01); *H05K 2201/10734* (2013.01)

(58) Field of Classification Search
USPC ........................................................ 361/767
See application file for complete search history.

(56) References Cited

U.S. PATENT DOCUMENTS

| | | | |
|---|---|---|---|
| 5,672,414 A | 9/1997 | Okamoto et al. | |
| 5,920,123 A | 7/1999 | Moden | |
| 6,119,338 A | 9/2000 | Wang et al. | |
| 6,187,652 B1 | 2/2001 | Chou et al. | |
| 6,259,039 B1 | 7/2001 | Chroneos, Jr. et al. | |
| 6,906,416 B2 | 6/2005 | Karnezos | |
| 6,982,387 B2 | 1/2006 | Hall et al. | |
| 7,061,087 B2 | 6/2006 | Kim | |
| 7,071,569 B2 | 7/2006 | Ho et al. | |
| 7,112,875 B1 | 9/2006 | Miks | |
| 7,183,643 B2 | 2/2007 | Gibson et al. | |
| 7,241,675 B2 | 7/2007 | Savastiouk et al. | |
| 7,841,080 B2 | 11/2010 | Muthukumar et al. | |
| 8,541,690 B2 | 9/2013 | Voraberger | |
| 8,767,409 B2 | 7/2014 | Cheng | |
| 9,167,686 B2 | 10/2015 | Chen et al. | |

(Continued)

*Primary Examiner* — Andargie M Aychillhum
(74) *Attorney, Agent, or Firm* — Fletcher Yoder PC

(57) ABSTRACT

Described herein are printed circuit boards (PCBs), PCB assemblies, and methods of manufacture thereof, which allow free placement of electrical components. The PCBs may have electrical pads that may couple to components through via-based connections and without the use of solder. The electrical components may be physically attached to the PCBs through tight fitting, lamination, and/or the use of adhesives. The distance between adjacent vias may be reduced, as accidental short-circuit risks due to solder bridging and similar effects are mitigated when the soldering process is bypassed. The PCB design and component placement may be flexible as to allow the use of electrical components with custom shape and/or customized terminal placement.

23 Claims, 9 Drawing Sheets

(56) References Cited

U.S. PATENT DOCUMENTS

2006/0079079 A1\* 4/2006 Muthukumar ........ H01L 21/486
                                                           438/618
2009/0010139 A1   1/2009 Kojima
2010/0029516 A1   2/2010 Willberg et al.
2017/0125613 A1\* 5/2017 Minixhofer ......... H01L 31/0203

\* cited by examiner

CONNECTION PAD FOR EMBEDDED COMPONENTS IN PCB PACKAGING

BACKGROUND

The present disclosure relates generally to electrical device packaging and assembly and, more specifically, to printed circuit boards with increased component density and flexibility.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electrical devices may employ printed circuit boards (PCB) as substrates for the design of electrical circuits containing components. The components, which may be semiconductor components, packaged semiconductor dies, passive components, connectors, integrated modules, system-on-chip devices, micro electromechanical system (MEMS) devices, are usually coupled to the PCB through soldering processes.

Terminals of the components may be soldered to pads in the PCB and connection between components may be produced by printed connection lines that connect the pads of the PCB to each other. To prevent solder bridging between adjacent solder connections, the pads may be placed with a minimum spacing. The spacing may prevent solder material in neighboring connections from coming into contact during the connection process (e.g., solder reflow process). However, spacing due to the use of solder-based connections may limit the component density in the PCB and constrains or limits the geometry of the printed circuit and of the type of components used in the PCB device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Described herein are embodiments of PCBs and PCB assemblies with flexible placement of electrical pads and terminations for connection to electrical components. The electrical connection between the electrical components and the PCB may take place through vias in the PCB. The terminations of the components may be directly contacting the surface termination of the vias, without any soldering. The physical attachment between the electrical components and the PCB may take place through tight fitting, lamination, application of a resin, or the use of adhesives. As a result of the obviation of the soldering process, the spacing between neighboring vias and/or pads may be reduced, allowing an increase in component density of the PCB assembly.

The use of via-based electrical pads may also increase the flexibility in the placement of the components and component terminations. As a result, the PCB assembly may include electrical components with customized shapes and/or customized terminal placement. This flexibility may further allow the circuit design method described herein to be unconstrained by physical limitations of fixed grid array (e.g., BGA array). That is, the shape and/or terminal placement of some or all of the electrical components may be determined based as a function of the conceptual design of the circuit.

With the foregoing in mind, an embodiment of a printed circuit board (PCB) assembly is described. The PCB assembly may have metallic routes that form an electrical circuit of the PCB assembly and electrical pads that may be electrically coupled to electrical components. A first electrical pad may have a termination of a via that is electrically coupled to the metallic routes. An electrical component electrically coupled to the first electrical pad may have a first termination that is in direct contact with the termination of the via in the first electrical pad, without a solder or a soldering material intermediating the electrical connection.

In addition to the above embodiments, an electronic device containing a PCB is also described herein. For example, the PCB may include an electrical circuit formed by metallic routes and metallic vias. The PCB may also include electrical pads. Each electrical pad may have a group of via terminations associated with the metallic vias of the electrical circuit. The electronic device may also include an electrical component coupled to electrical circuit and disposed in an electrical pad. To form the electrical coupling, each termination of the electrical component may be in direct contact with a termination of a via, without any solder material.

Additional embodiments described herein may also include a method for manufacturing of a PCB assembly. The method may include steps for forming a metallic route in a core of a PCB, and forming a via in the PCB. The via may be electrically coupled to the metallic route. A termination of the via may be exposed in an electrical pad of the PCB. The method may also include steps for placing the electrical component in the electrical pad such that the termination of the electrical component is in direct contact with termination of the via in the electrical pad.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
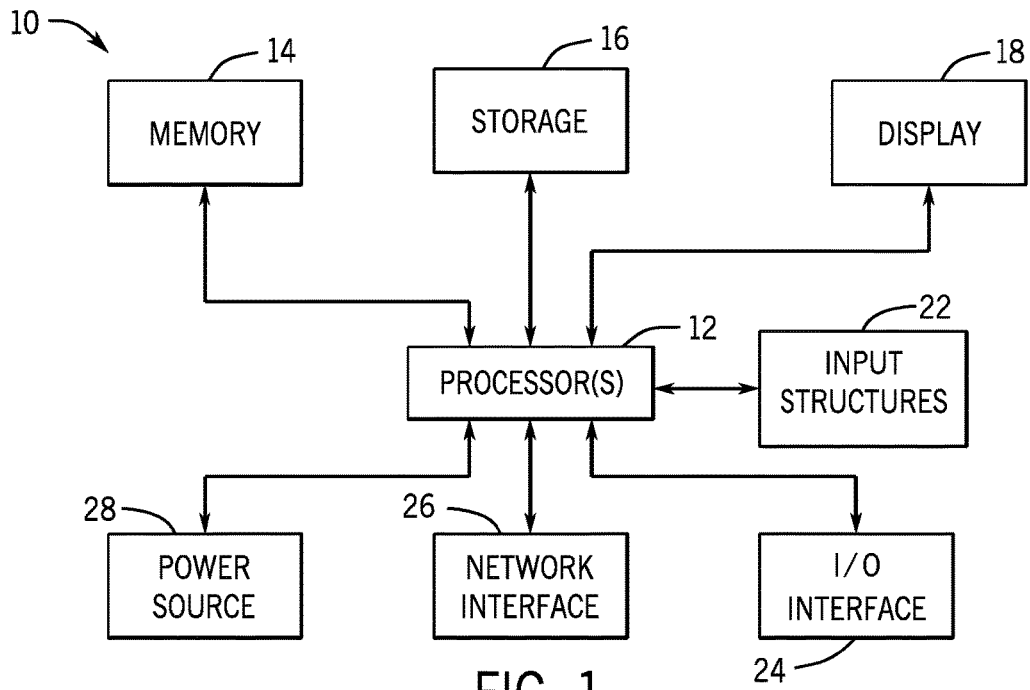
FIG. 1 is a diagram of an electrical device that may use printed circuit boards (PCBs) with improved (e.g., optimized) via-based pads, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electrical devices may have electrical circuits to implement one or more functionalities. The electrical circuits may be implemented using printed circuit boards (PCBs), which may provide a substrate for laying out metallic routes and vias and for attaching discrete electrical components. The routes, vias, and electrical components may then form the electrical circuits that perform the functions for the electrical device. The discrete components may be, for example, semiconductor components, packaged semiconductor dies, passive components, connectors, integrated modules, system-on-chip devices, and/or micro electromechanical system (MEMS) devices, and these components may have terminations for electrical coupling with the circuit. Conventionally, the component terminations are soldered to electrical pads in the PCB. Due to the melting and solidification of the solder material (e.g., flux, solder) during the soldering process (e.g., reflow), a risk of undesired connection between adjacent terminals (e.g., solder bridges) may exist. To mitigate these risks, spacing may be added between electrical pads to mitigate solder-bridging risks. However, the spacing specifications may impose constraints in the placement and density of the connection pads. For example, a ball grid array (BGA), a soldering technology, employs evenly spaced rectangular arrays that impose constraints in the type, shape, and orientation of the components that may be affixed to the PCB.

To increase component density in electrical devices, embodiments described herein include PCBs, PCB assemblies, and methods for designing and manufacturing PCBs and PCB assemblies. The described embodiments allow free placement of PCB connectors for electrical coupling to discrete components. The electrical connection between the components and the PCB may take place through via-based pads in the PCB and the physical attachment between the components and the PCB may take place through fitting (e.g., the component is locked in place), lamination, application of a resin, or the use of adhesives, thereby obviating the use of a soldering process. As a result, the spacing between neighboring pads may be reduced, increasing the component density in the PCB assembly. Encapsulation using resins may allow via-based connections between routes and embedded components, which may further increase component density in the PCB assembly. Moreover, the use of via-based connection pads may increase the flexibility in the placement of the components. As a result, the PCB design and component placement may be made in a more efficient manner, allowing the use of components with customized shapes and/or customized terminal placement.

With the foregoing in mind, provided below is a general description of suitable electronic devices having printed circuit boards with the improved (e.g., optimized, for example, through the use of via-based) connection pads. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, a network interface 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
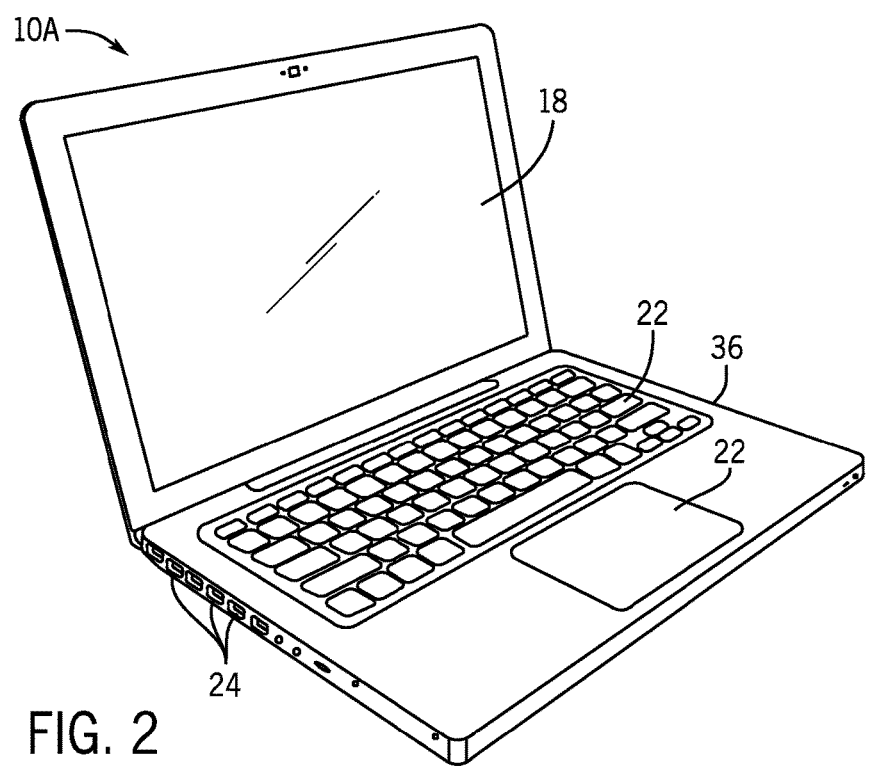
FIG. 2 is a perspective view of a notebook computer that may employ the PCBs with via-based pads described herein, in accordance with an embodiment.
Figure 4:
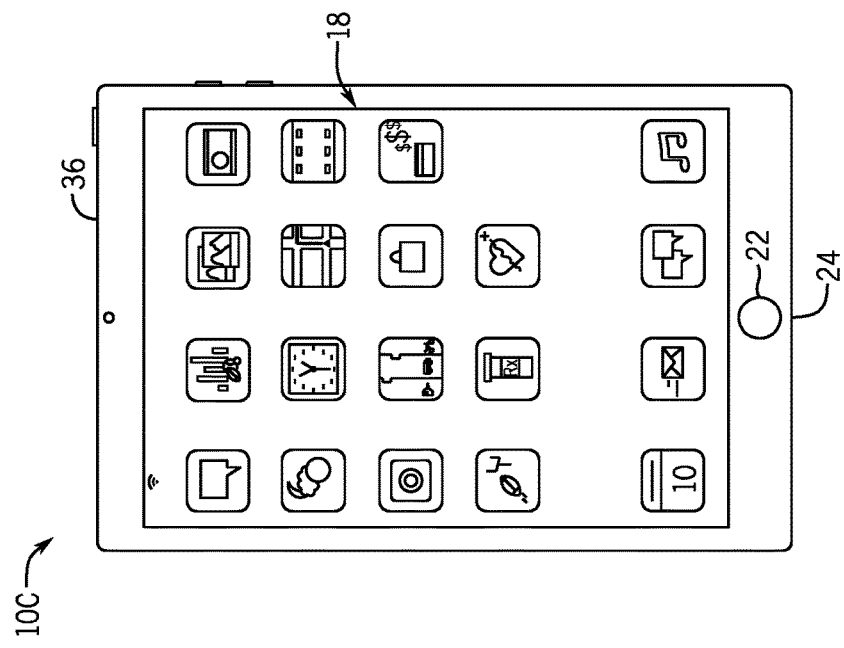
FIG. 4 is a front view of portable tablet computer that may employ the PCBs with via-based pads described herein, in accordance with an embodiment.
Figure 3:
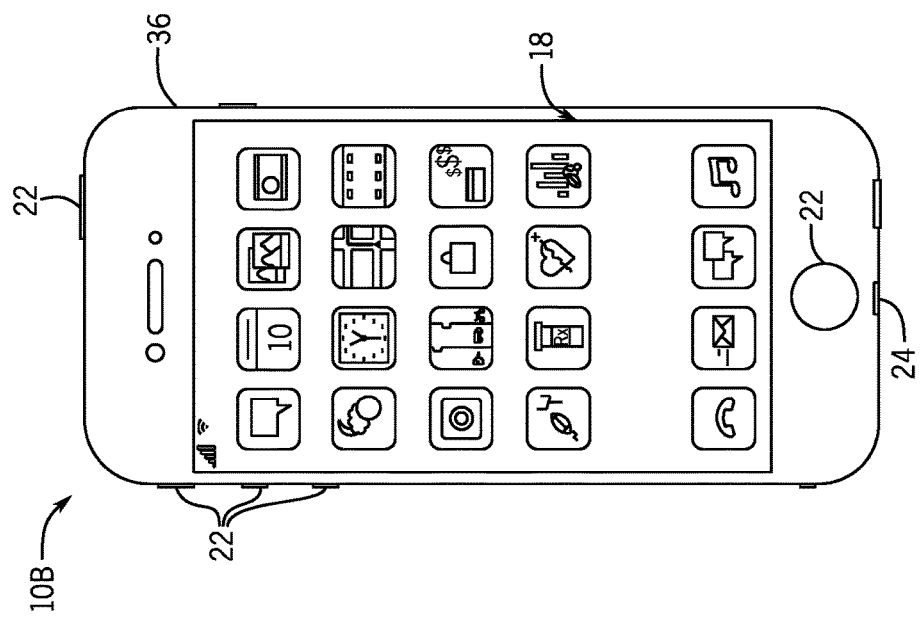
FIG. 3 is a front view of a hand-held device that may employ the PCBs with via-based pads described herein, in accordance with an embodiment.
Figure 5:
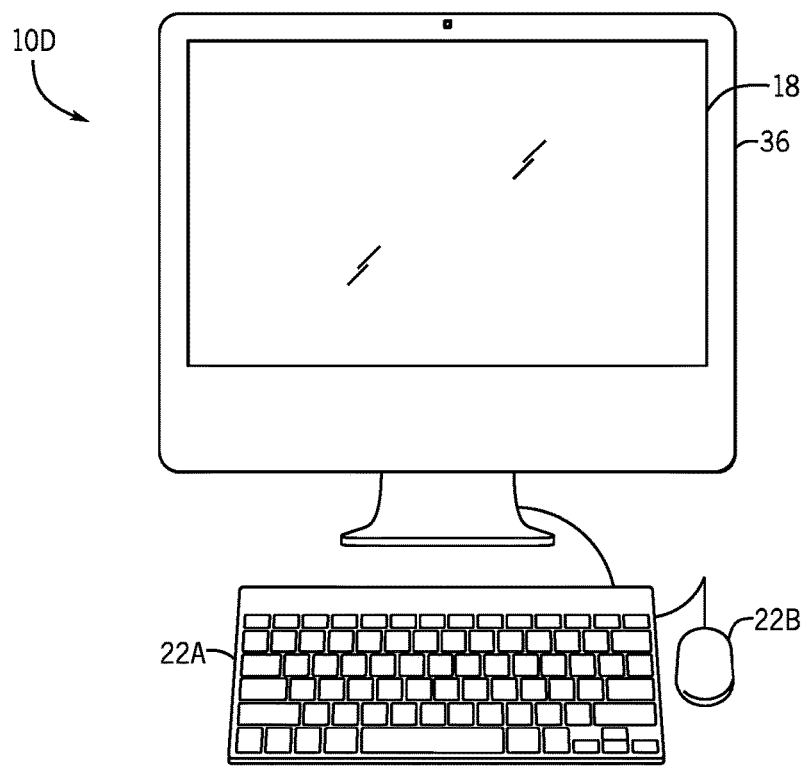
FIG. 5 is a front view of a desktop computer that may employ the PCBs with via-based pads described herein, in accordance with an embodiment.
Figure 6:
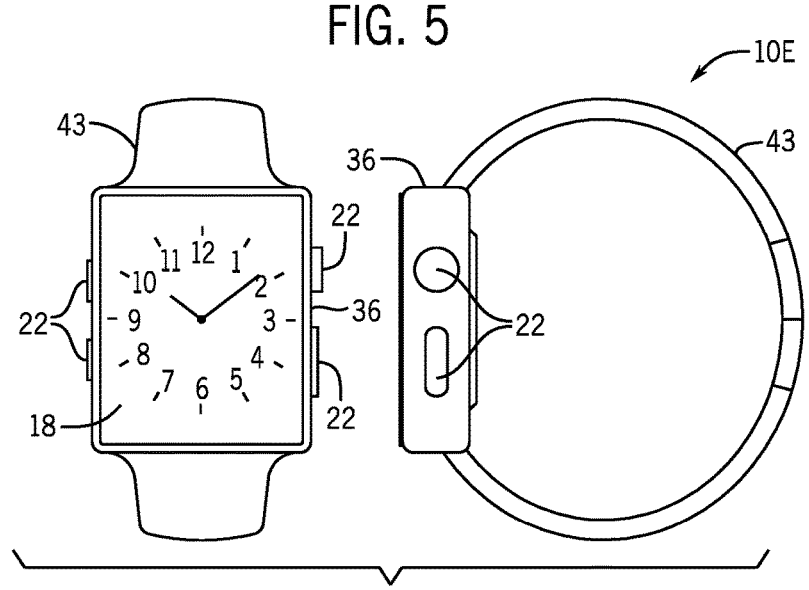
FIG. 6 is a front and side view of a wearable electrical device that may employ the PCBs with via-based pads described herein, in accordance with an embodiment.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor(s) 12 to enable the electronic device 10 to provide various functionalities.

In certain embodiments, the display 18 may be a liquid crystal display (LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, one or more interfaces for a personal area network (PAN), such as a Bluetooth network, for a local area network (LAN) or wireless local area network (WLAN), such as an 802.11x Wi-Fi network, and/or for a wide area network (WAN), such as a 3rd generation (3G) cellular network, 4th generation (4G) cellular network, long term evolution (LTE) cellular network, or long term evolution license assisted access (LTE-LAA) cellular network. The network interface 26 may also include one or more interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra-Wideband (UWB), alternating current (AC) power lines, and so forth. As further illustrated, the electronic device 10 may include a power source 28. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard-wired connection for charging and/or content manipulation using a standard connector and protocol, such as the Lightning connector provided by Apple Inc., a universal serial bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E. The electronic devices 10A, 10B, 10C, 10D, and 10E described above may all employ high-density and/or high-performance PCBs that may have embedded components and/or coupled components attached to the circuitry through via-based improved (e.g., optimized) connection pads.

The description of the embodiments may include references to conductive elements of the PCB, such as routes, traces, and/or vias. As described herein, routes or metallized routes may refer to any metallized element that may be a part of a conductive path in an electrical circuit of a PCB, and may refer to traces and vias. Trace or metallized trace may refer to a metallic route generated within a single layer of a PCB, and may be parallel to the plane defined by the PCB surfaces. Traces may be in the surfaces of the PCB or may be embedded within the PCB, such as in a multilayer PCB. A trace may be produced by an etching process of a PCB core containing an insulating material laminated with a conductor material. Via or metallized via may refer to a metallic route that connects different layers of a PCB, and may be perpendicular to the plane defined by the PCB surfaces. A via may be produced by drilling a hole through a PCB core and filling (e.g., plating) the whole with metallization.

Figure 7:
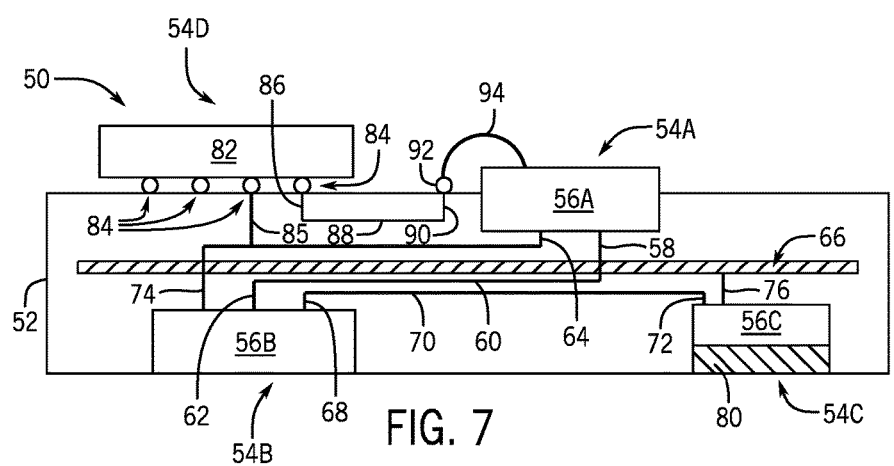
FIG. 7 is a front view of a PCB assembly that has components coupled to the PCB using a via-based pad, in accordance with an embodiment.

FIG. 7 illustrates a front view of a PCB assembly 50 with via-based connection pads. The PCB assembly 50 may include a PCB 52 may have connection pad regions 54A, 54B, 54C, and 54D. Electrical components 56A, 56B, and 56C are coupled to the connection pad regions 54A, 54B, and 54C, respectively. In addition, component 56A may be connected to component 56B through an electrical path that may include a via 58, a PCB trace 60, and a via 62. FIG. 7 provides further illustrations of the via-based connection. The component 56A may also be coupled through a via 64 to a ground plane 66 for grounding. The component 56B may be coupled to the component 56C through an electrical path that may include a via 68, a PCB trace 70, and a via 72. The component 56B may be coupled to the grounding plane 66 through a via 74. Similarly, the component 56C may be coupled to the ground plane 66 through a via 76.

Due to the use of the via-based pads, the components may be coupled directly to vias, without any soldering material. In via-based pads, vias formed in the PCB core may have an exposed termination (e.g., a via termination) placed in the electrical pad. The electrical coupling between a component and the PCB may take place by having terminations of the components (e.g., component terminations) placed in direct contact with terminations of the via (e.g., via terminations), without the use of solder or other intermediate material. For example, component 56A may be coupled directly to vias 58 and 64, component 56B is coupled directly to vias 62 and 74, and component 56C may be directly coupled to vias 72 and 76.

Electrical components may be held in place in the PCB by fitting and/or by lamination. Fitted components may be components that have a dimension that may be substantially similar to a cavity, such that the component stays in place (e.g., locked in place) without adhesives or solder. In an example illustrated in FIG. 7, the component 56A may be fitted in the cavity of the connection pad region 54A, as illustrated. Similarly, component 56B may be fitted in the cavity of the connection pad region 54B. Electrical components may be also held in place by using lamination or application of a resin. For example, component 56C may be embedded in the PCB 52 and held in place by a fill-in resin 80.

Components may also be coupled to via-based pads through conventional soldering methods. In an example illustrated in FIG. 7, component 82 may be connected to the connection pad region 54D through solder balls 84. As illustrated, a solder ball 84 couples a terminal of the component 82 to a via 85, which is coupled to the grounding plane 66. As such, the use of the via-based connection pad may be backwards compatible, i.e., components may be coupled using solder-based technologies, such as ball grid arrays (BGAs), in portions of the PCB.

The use of via-based pads and/or the presence of cavities in connection pad regions may allow the use of terminals in two different surfaces of a component. In an example illustrated in FIG. 7, component 56A is connected to component 82 through an electrical path that includes a solder ball 84, a via 86, a PCB trace 88, a via 90, a solder ball 92, and a wire 94 in a top side. The wire 94 is connected to a top side of the component 56A. As described above, vias 58 and 64 are coupled to a bottom side of the component 56A. The flexibility of this connection may allow the use of customized components, such as die having transistor connections in a bottom and power connections in a top region. In such system, signals in the power connections may be prevented from interfering with the control signals due to vertical separation, thereby enabling the use of components that are more compact.

Figure 8:
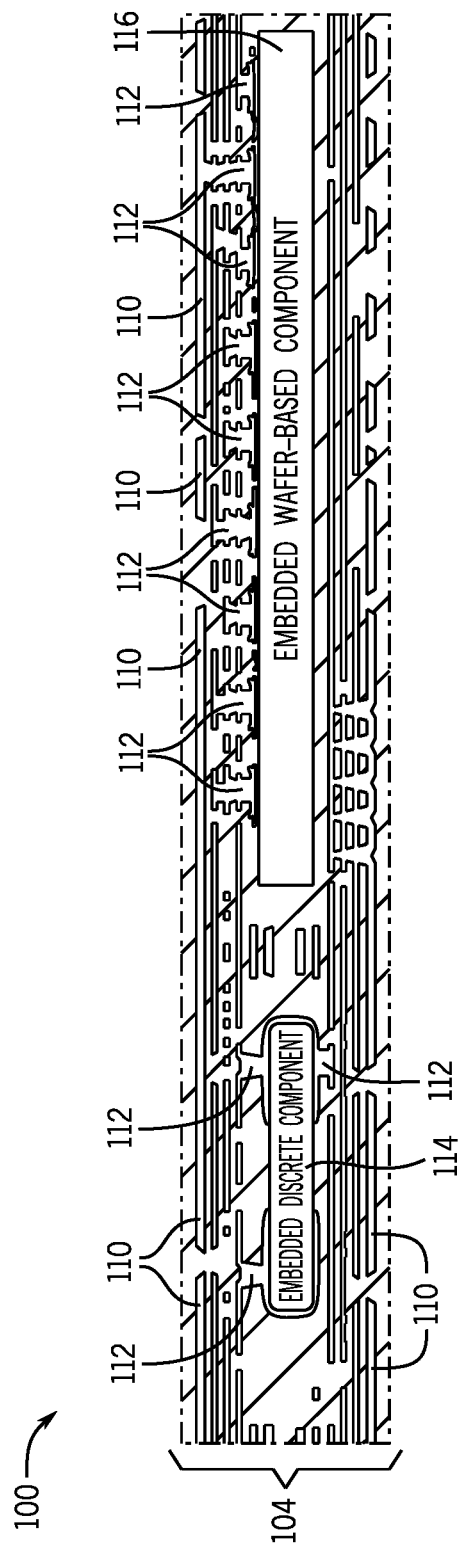
FIG. 8 is a front view of a PCB assembly with multiple multilayer PCBs, and that include embedded components connected to the PCB using a via, in accordance with an embodiment.

FIG. 8 is a side view image 100 of a PCB assembly having a multilayer PCB 104. The multilayer PCB 104 may have traces 110 and vias 112 forming the electrical circuits. The multilayer PCB 104 may also include an embedded discrete component 114, and an embedded wafer-based component 116. At the cross-section of the side view image 100, the embedded discrete component 114 may have three terminals that are directly connected to vias 112. It should be noted that the connection between the embedded discrete component 114 and the vias 112 did not employ any soldering, and may be obtained through juxtaposition. Similarly, at the cross-section of the side view image 100, the embedded wafer-based component 116 may have 9 vias 112 used to couple the embedded wafer-based component 116 to the multilayer PCB 104. It should be further noted that the capacity to embed components, such as the embedded discrete component 114 and the embedded wafer-based component in the intermediate PCB 104 may increase the component density and allow a more compact PCB assembly.

Figure 9:
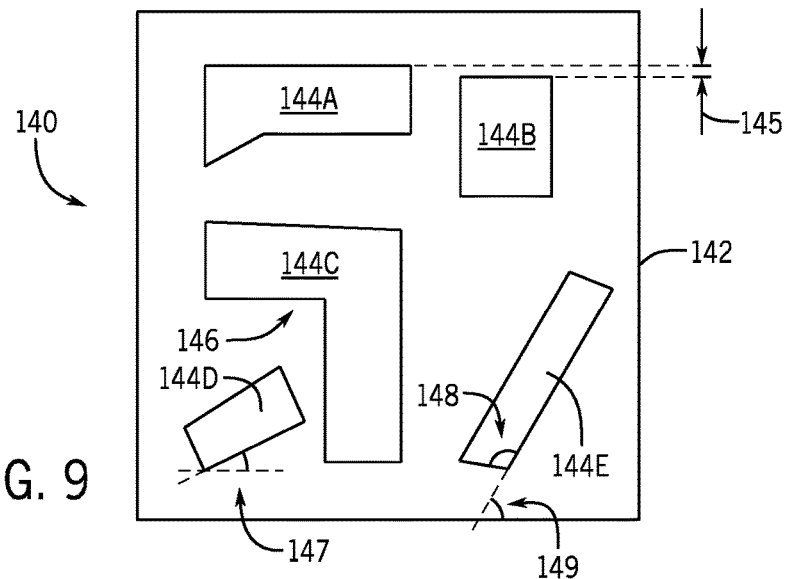
FIG. 9 is a top view of a PCB assembly that has components coupled to the PCB using via-based pads, in accordance with an embodiment.

Moreover, the use of via-based pads described herein allow flexible arrangement of components in a PCB. The use of vias coupled to components with the use of soldering may allow reduction of the space between adjacent connectors and, thus, decrease the constraints in the location of the via-based connectors. FIG. 9 illustrates the flexible arrangement that may be obtained using via-based pads by means of a top view 140 of a PCB 142. The top view 14 illustrates components 144A, 144B, 144C, 144D, and 144E attached to the PCB 142 using the pads described herein. In solder base methods, layout of components of a PCB may follow a fixed grid. In BGA methods, for example, the solder balls may be laid out in a rectangular grid with some minimum edge distance or grid pitch (e.g., of 200 µm pitch). The use of via-based pads may increase the flexibility in the connection. In the PCB 142, components 144A and 144B may be conventional shaped components that are not laid out in a fixed grid. As a result, a horizontal offset 145 between the position of components 144A and 144B may have a variety of lengths, and is not necessarily restricted to a multiple of a grid pitch, as is the case in conventional solder-based technologies.

The use of via-based pads may also allow flexible design in the shape of components. The L-shaped component 144C may have a concave portion 146. The flexibility may also allow the placement of components at an angle. Component 144D may be a conventional shaped component that is placed at an angle 147 with respect to the edges of the PCB. The angle 147 may be any suitable angle, and may be chosen to improve (e.g., optimize) component density. In the illustrated example, angle 147 may improve (e.g., optimize) the floorplan area of the PCB used by components 144C and 144D. Another example of a component placed at an angle is illustrated by component 144E. Component 144E may be have an angled shape, with an angle 148 in the packaging of the component, and may be placed at an angle 149 with respect to the edges of the PCB.

Figure 10:
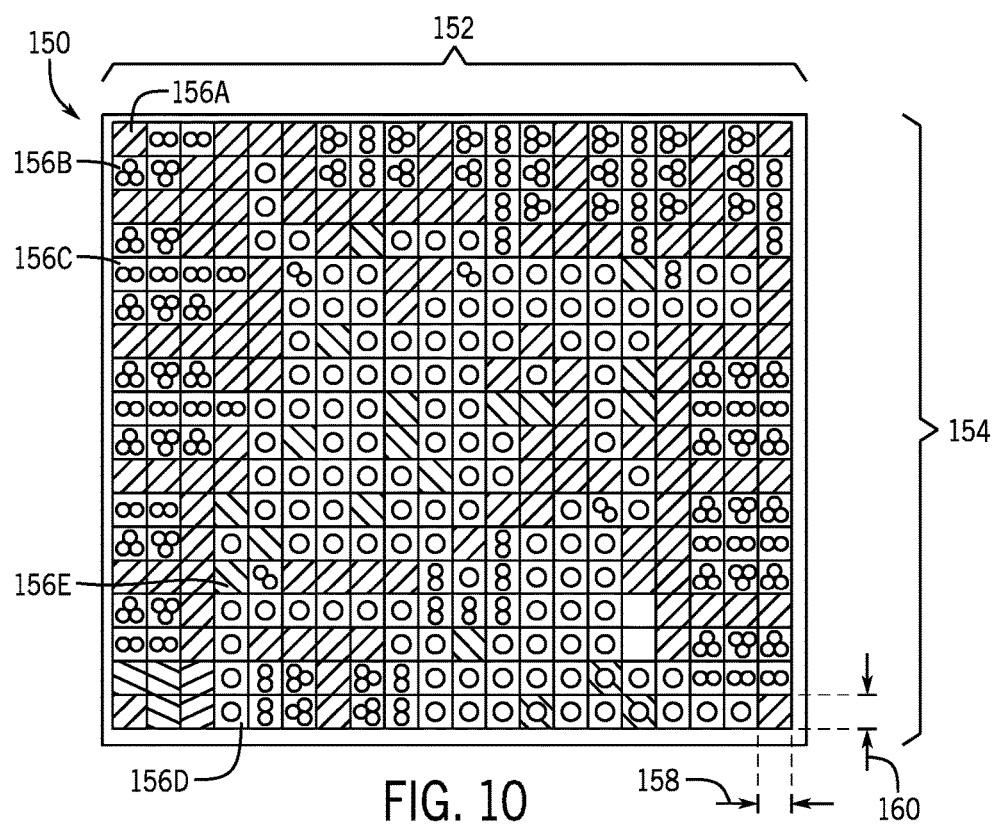
FIG. 10 is a top view of a PCB with via-based pads arranged in a regular array, in accordance with an embodiment.

The flexible positioning of components in a PCB, as illustrated in FIG. 9, may be facilitated by the adjustable positioning of vias in the PCB. The electrical pad array 150 in FIG. 10 illustrates a layout for electrical pads and positioning of vias that allows flexible position of components in the PCB. The electrical pad array 150 may be formed by columns 152 and rows 154 of pads (e.g., non-electrical pads 156A, electrical pads 156B, 156C, and 156D, and shielding pads 156E). The electrical pad array 150 may a uniform array (e.g., regularly spaced array) and each electrical pad may have uniform dimensions, such as width 158 and length 160. In some embodiments, the electrical pad may have a width similar to a regular ball grid array width (e.g., width 158 and/or length 160 of about 200 μm or 350 μm). However, the separation between vias within the electrical pad may be substantially smaller (e.g., a pitch of about 10-50 μm as compared to the width 158 and/or length 160). In the illustrated electrical pad array 150, a non-electrical pad 156A may be placed in regions where a component is not expected to be electrically coupled to any other component or route of the PCB assembly.

The electrical pad array 150 may also have electrical pads 156B, 156C, and 156D. In the illustrated system, the electrical pad 156B may have 3 exposed vias, the electrical pad 156C may have two exposed vias, and the electrical pad 156D may have a single exposed via. A terminal of a component may be coupled to the PCB through the via interconnect without soldering, as discussed above. The number and placement of each via within the electrical pad may be adjusted based on the component layout, such as the one illustrated in top view 140 of FIG. 9. The electrical pad array 150 may also include a shielding pad 156E, which may be a metallized electrical pad that may be connected to a ground of the PCB or may be disconnected from any metallized route within the PCB. The shielding pad 156E may provide insulation to neighboring pads. The use of via-based pads allows the use of shielding pads 156E, due to the dimensions of the vias and the absence of soldering. As the vias do not cover the entire area of the electrical pads 156B, 156C, and 156D, the risk of shorts between shielding pads 156E and neighboring electrical pads is reduced. Moreover, as the via-based pads allow coupling without soldering, solder bridging does not become a constraint in the placement of shielding metallization, such as in shielding pads 156E.

Figure 11A:
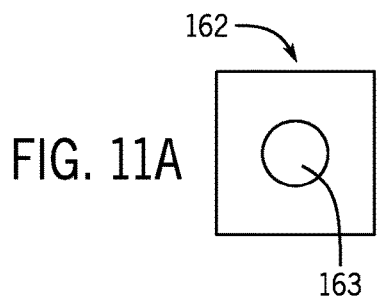
FIG. 11A is a layout of a via-based pad with a single connector, in accordance with an embodiment.
Figure 11B:
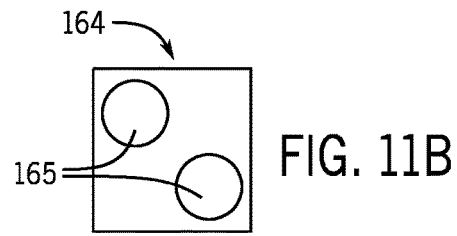
FIG. 11B is a layout of a via-based pad with two connectors, in accordance with an embodiment.

FIGS. 11A, 11B, 11C, and 11D further describe via-based electrical pads. FIG. 11A illustrates an electrical pad 162 with a single via 163 for connection. The electrical pad 162 may be used for coupling of signals that may be low frequency and/or low current, and may reduce metallization utilization and increased flexibility of positioning. FIG. 11B illustrates an electrical pad 164 with two vias 165. The electrical pad 164 may be used for connections that may have an increased frequency and/or current and wherein lower impedance between the component and the PCB may be beneficial. In such situation, a single terminal of the component may be designed to be broad and to contact both vias 165. The electrical pad 164 may also be used for connection with two different components, with each via 165 configured to connect to a different component. The electrical pad 164 may also be used for connection with two different terminals of a single component.

Figure 11C:
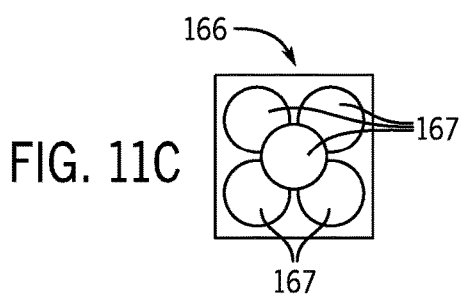
FIG. 11C is a layout of a via-based pad with multiple connectors, in accordance with an embodiment.
Figure 11D:
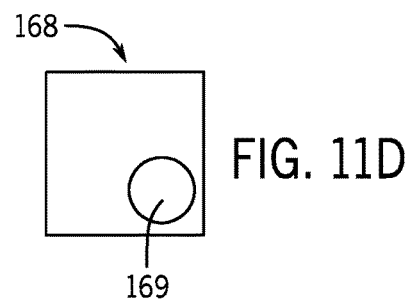
FIG. 11D is a layout of a via-based pad with an offset connector, in accordance with an embodiment.

FIG. 11C illustrates an electrical pad 166 with a high bandwidth connection using 5 vias 167. The 5 vias 167 may form a single connection. The electrical pad 166 may be used in situations where very low impedance between the component terminal and the PCB may be beneficial. For example, the electrical pad 166 may be used with high frequency and/or high current signals. More generally, the number of vias in an electrical pad may be determined based on a resistance specification and/or an inductance specification for the electrical connection between the PCB and the terminal. FIG. 11D illustrates an electrical pad 168 with a single offset via 169. The electrical pad 168 may have electrical characteristics similar to the electrical pad 162 of FIG. 11A while providing flexibility for position of component in the PCB. For example, if terminal of a component configured to couple to the PCB is not located directly above the center of the electrical pad, the offset via 169 may be placed directly under the terminal of the component. It should be noted that, while the above descriptions of the electrical pads also include certain use cases that would benefit from such use, the use of the electrical pads are not necessarily limited to the use case descriptions provided.

Figure 12:
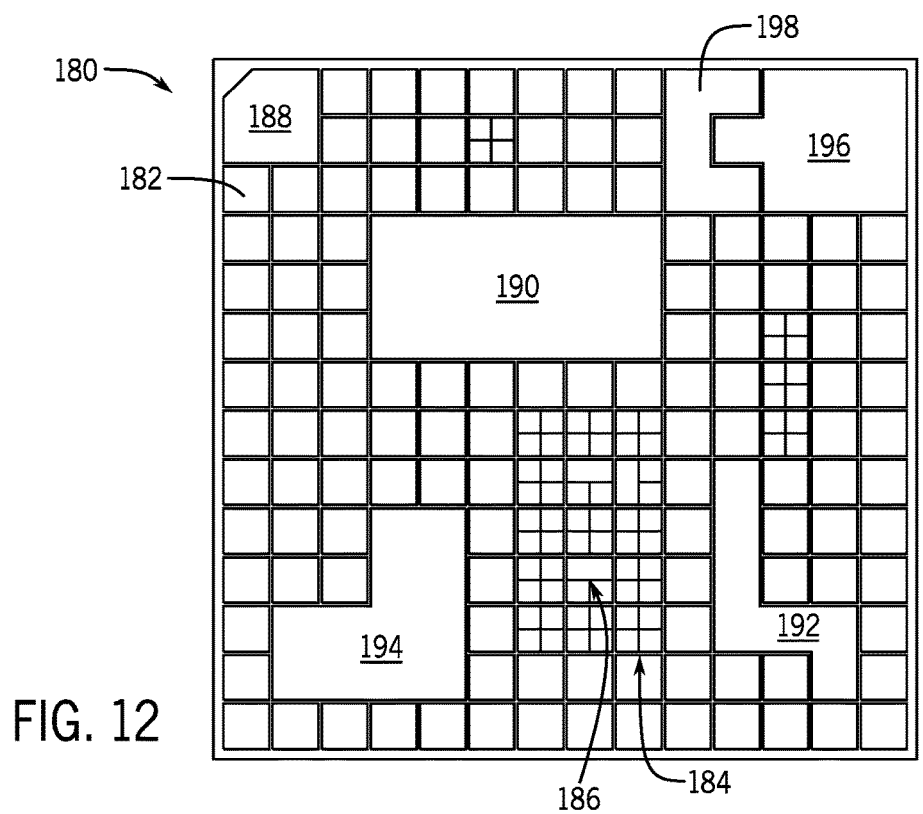
FIG. 12 is a top view of a PCB with via-based pads with varying shapes, in accordance with an embodiment.

By employing different numbers of vias in each pad, the type, shape, and number of components placed in the PCB assembly may increase due to the flexibility provided by the different via arrangements. For instance, the via-based electrical pads may also be placed in a non-uniform (e.g., non-symmetric, amorphous, non-regular, non-grid) layout. The PCB layout 180 of FIG. 12 describes a non-uniform arrangement of electrical pads for a PCB. The PCB layout 180 may have a standard pad 182 which may have standard dimensions, and may be similar to the electrical pads of the electrical pad array 150. Standard pads 182 may be used to facilitate the design of circuits that use standard-sized components. Due to the reduced dimensions of the vias, the PCB layout 180 may have smaller pads than the standard pad 182. For example, quarter-sized pads 184 and half-sized pads 186 may be used. Moreover, larger pads, such as the 2×2 pad 188 and the 6×3 pad 190 may be used. The pads with dimensions that are a fraction or a multiple of the dimensions of the standard pads may be used to facilitate design of circuits that use standard-sized components.

As with the electrical pads illustrated in the 150, the electrical pad may have one or more vias, which may be used to couple to one or more components. Non-uniform pads may also be used in the PCB layout 180. For example, pads 192 and 194 may have a shape that is not necessarily convex. Such pad may be used for placement of customized components, and may facilitate increase in the component density of the PCB layout 180. The PCB layout 180 may also include nested pads 196 and 198. Nested pads may refer to a pair of pads with complementary jigsaw-like portions. For example, pad 198 may have a concave portion and pad

196 may have a protrusion that fits the concave portion, as illustrated. Nested pads 196 and 198 may be used for coupling different electrical components with complementary shapes, to increase the density of the PCB layout 180. Nested pads 196 and 198 may also be used to provide shielding, as discussed below, with respect to FIG. 13.

Figure 13:
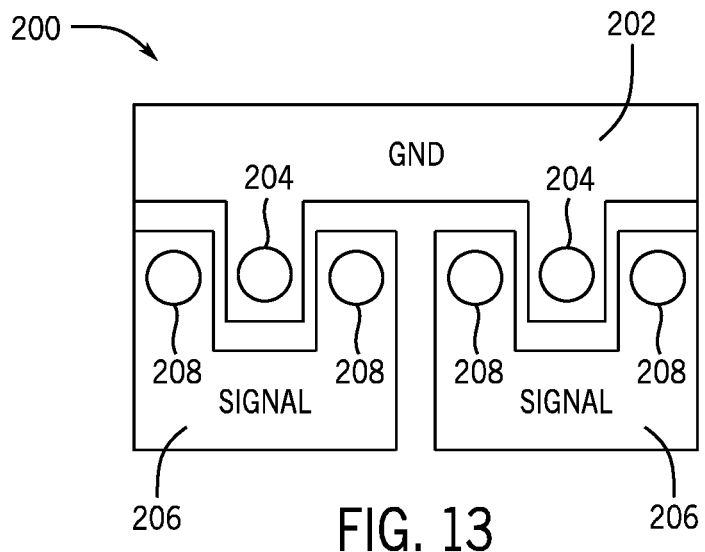
FIG. 13 is a layout for neighboring pads that may have a jigsaw arrangement, in accordance with an embodiment.

The top view 200 of FIG. 13 illustrates nested electrical pads that may be used for improved shielding. The top view 200 illustrates a shielding pad 202 that is nested with two adjacent electrical pads 206. The shielding pad 202 may be coupled to a ground of the PCB through vias 204, and may be metallized. As a result, the entire surface of the shielding pad 202 may be grounded. Moreover, the adjacent electrical pads 206 may be used to couple the PCB to a component through vias 208. The nested geometry between shielding pad 202 and the adjacent electrical pads 206 allows the vias 208 to be surrounded by the metallized ground of the shielding pad 202. The resulting electrical shielding of the connections provided by the adjacent electrical pads 206 may improve the signal quality. As a result, the nested pad layout may be used to obtain signal shielding in the connection between an electrical component and the PCB without the use of additional space.

Figure 14:
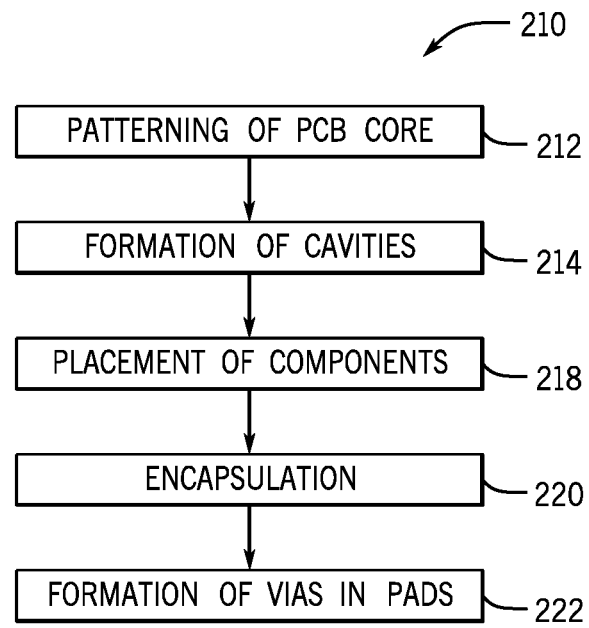
FIG. 14 is a method for assembly of a PCB with via-based pads, in accordance with an embodiment.

FIG. 14 describes a method 210 for production of PCB assemblies using the via-based pads described above based on a PCB design. In certain embodiments, the method 210 may be performed using a fabrication system that etches, drills, and/or deposits conductive, semiconducting, and/or insulating materials based on commands received from a control system or a similar system. In a process 212, one or more layers of PCB core that form the multilayer PCB assembly may be patterned. The patterning in process 212 may form the traces of the PCB design, and may include vias. In a process 214, cavities for placement of electrical components may be formed. The shape and location of the cavities may be determined based on the shape of the component and the location of the vias in the PCB design. The cavity dimensions may provide tight tolerance margins to prevent movement of the component relative to the PCB. For example, the cavity dimensions may have a tolerance margin in a range of 5-15 µm in a PCB assembly in which the diameter of a via is in a range of 20-40 µm. Moreover, the cavity shape may lock a component in place, as discussed above. To that end, the cavity may have the same dimensions as the component.

In a process 218, electrical components may be placed in the cavities attached to the PCB core. Some cavities may lock in place the electrical components. Some electrical components may be held with an adhesive. In a process 220, the components may be encapsulated with a resin. The electrical components may be fully encapsulated (e.g., the entire component is covered by the resins) and, as a result, become embedded in the PCB assembly. Certain components may be encapsulated without embedding. For example, encapsulation may take place by placement of the resin along the boundaries of the cavity to lock a component in place. In a process 222, vias may be formed in the PCB core. The vias may form above-electrical pads that connect to the components. The electrical pad vias may be located within the cavities. The electrical pad vias may couple to the traces and expose the electrical circuit for coupling with a terminal of an electrical component. It should be noted that the processes 212, 214, 218, 220, and 222 of method 210 are not necessarily performed in the described order. Moreover, it should be noted that the method 210 is a method for manufacture and may be performed in an automated fabrication system.

Figure 15:
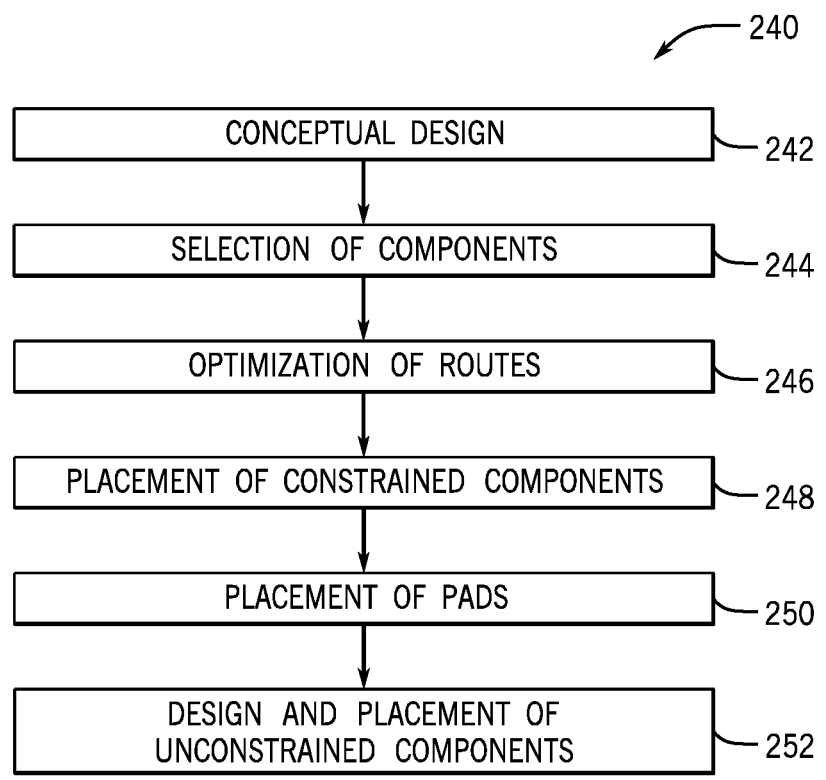
FIG. 15 is a method for design of a PCB assembly of an electronic device using PCB with via-based pads and customized components.

FIG. 15 illustrates a method 240 to obtain a PCB design that employs the flexible placement of electrical vias discussed above. The method 240 may be used to generate automated instructions that may be executed by a fabrication system, such as a fabrication system similar to one that implements method 210. Moreover, the method 240 may be implemented by a controller that controls the fabrication system. In an initial process 242, a conceptual design may be obtained. The conceptual design may include a schematic and/or functional description of the components, inputs, and/or output signals, and may include specifications such as the electrical characteristics for connections, timing constraints, and/or impedance constraints. In a process 244, components may be selected for implementation. The components may be chosen based on the functional descriptions and/or specifications of the conceptual design. In a process 246, routes connecting the electrical components may be designed. The routes may be improved (e.g., optimized) in view of the electrical characteristics, timing constraints, and/or impedance constraints. It should be noted that the flexible position of the components in the PCB, facilitated by the via-based electrical pads, may substantially decrease spatial constraints for the electrical components and the routes. As a result, the components selected during process 244 and the routes designed in process 246 may satisfy the conceptual design from process 242 more closely than a BGA-based PCB design.

In processes 248, 250, and 252, the physical design of the PCB assembly may take place. In process 248, constrained components may be placed. Constrained components may be pre-designed components, externally sourced components, or any other components that have a fixed (i.e., non-customizable) shape and component termination layout. In a process 250 floor plan space may be allocated for pads destined for the constrained components may. Following the allocation of pads for the constrained components, the available space in the PCB floor plan may be allocated for unconstrained (i.e., customizable) components in process 252. Unconstrained components may be components that have a non-rectangular, non-convex, or non-conventional shape. Unconstrained components may also be components that have a conventional shape that was determined in view of the conceptual design and/or the available floor plan in process 250. Following the placement of the unconstrained components in the PCB design, traces and vias may be designed, and a manufacturing process may be generated. It should be noted that the method 240 or some of its processes may be implemented in an electrical circuit synthesis tool (e.g., a place and route software).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A printed circuit board (PCB) assembly, comprising:
   a first plurality of metallic routes that form an electrical circuit of the PCB assembly and comprises a first metallic trace disposed in a core of the PCB assembly;
   a plurality of electrical pads, wherein a first electrical pad of the plurality of electrical pads comprises a first via termination of a first via and the first via is electrically coupled to the first metallic trace; and
   an electrical component electrically disposed in the first electrical pad, wherein a first component termination of the electrical component is directly contacting the first via termination.

2. The PCB assembly of claim 1, wherein the plurality of electrical pads is arranged in a grid array that comprises a plurality of rows and a plurality of columns, and wherein each electrical pad comprises a width and a length.

3. The PCB assembly of claim 2, wherein the width is 200 µm or the length is 200 µm.

4. The PCB assembly of claim 1, wherein the first electrical pad comprises a second via termination of a second via.

5. The PCB assembly of claim 4, wherein the electrical component comprises a second component termination directly in contact with the second via termination of the second via.

6. The PCB assembly of claim 4, comprising a second electrical component disposed in the first electrical pad, wherein a second component termination of the second electrical component is directly contacting the second via termination of the second via.

7. The PCB assembly of claim 1, wherein the first electrical pad comprises a plurality of vias electrically coupled to each other and configured to form a single connection to the first component termination of the electrical component, wherein a number of vias in the plurality of vias is based on a resistance specification or an inductance specification, and wherein the resistance specification or the inductance specification is based on the electrical component.

8. The PCB assembly of claim 1, comprising a first cavity that comprises the first electrical pad, and wherein the electrical component is disposed in the first cavity.

9. The PCB assembly of claim 8, comprising a resin configured to hold the electrical component in the first cavity.

10. An electronic device, comprising:
    a printed circuit board (PCB), comprising:
    a first electrical circuit that comprises a plurality of metallic traces disposed in a core of the PCB and a plurality of metallic vias, wherein each via of the plurality of metallic vias is coupled to a first metallic trace of the plurality of metallic traces;
    a plurality of electrical pads, wherein each electrical pad of the plurality of electrical pads comprise a plurality of via terminations, and each respective via termination of the plurality of via terminations is associated to a respective via of the plurality of metallic vias; and
    an electrical component electrically coupled to the first electrical circuit and disposed in a first electrical pad of the plurality of electrical pads, wherein each respective component termination of the electrical component is in direct contact with a corresponding via termination of the plurality of via terminations.

11. The electronic device of claim 10, wherein the first electrical pad is a non-uniform electrical pad.

12. The electronic device of claim 10, comprising a second electrical pad of the plurality of electrical pads, wherein the second electrical pad comprises a shielding pad electrically coupled to a ground of the PCB.

13. The electronic device of claim 12, wherein the first electrical pad and the second electrical pad are nested, and wherein the shielding pad is configured to provide electrical shielding to at least one via termination of the plurality of via terminations.

14. The electronic device of claim 10, comprising a second electrical component, wherein the second electrical component is soldered to the PCB.

15. The electronic device of claim 10, wherein the first electrical pad comprises a cavity and the electrical component is disposed in the cavity.

16. The electronic device of claim 15, comprising a resin that covers the electrical component.

17. The electronic device of claim 10, wherein the PCB comprises a multilayer PCB.

18. A method comprising:
    forming a first metallic trace in a core of a printed circuit board (PCB);
    forming a first via in the PCB, wherein the first via is electrically coupled to the first metallic trace, and wherein a via termination of the first via is exposed in an electrical pad of the PCB; and
    disposing a first electrical component in the electrical pad of the PCB by forming a direct contact between a component termination of the first electrical component and the via termination of the first via.

19. The method of claim 18, comprising forming a cavity in the core of the PCB, wherein the cavity is configured to receive the first electrical component.

20. The method of claim 19, comprising encapsulating the first electrical component using a resin.

21. A printed circuit board (PCB) assembly, comprising:
    a first plurality of metallic routes that form an electrical circuit of the PCB assembly;
    a plurality of electrical pads, wherein a first electrical pad of the plurality of electrical pads comprises:
    a first via termination of a first via, wherein the first via is electrically coupled to the first plurality of metallic routes plurality of vias electrically coupled to each other and to the first plurality of metallic routes and wherein the plurality of vias form a single connection;
    a plurality of vias electrically coupled to each other and configured to form a single connection to the first component termination of the electrical component, wherein a number of vias in the plurality of vias is based on a resistance specification or an inductance specification, and wherein the resistance specification or the inductance specification is based on the electrical component; and
    an electrical component electrically disposed in the first electrical pad, wherein a first component termination of the electrical component is directly contacting the first via termination and comprising a first component termination in direct contact with the single connection.

22. The PCB assembly of claim 21, wherein the electrical component comprises a second component termination in direct contact with a second connection disposed in the first electrical pad.

23. The PCB assembly of claim 21, comprising a first cavity that comprises the first electrical pad, and wherein the electrical component is disposed in the first cavity.

\* \* \* \* \*